United States Patent [19]
Kazerounian et al.

[11] Patent Number: 5,910,016
[45] Date of Patent: Jun. 8, 1999

[54] SCALABLE EPROM ARRAY

[75] Inventors: Reza Kazerounian, Alameda; Rustom F. Irani, Santa Clara, both of Calif.; Boaz Eitan, Ra'anana, Israel

[73] Assignee: Waferscale Integration, Inc., Fremont, Calif.

[21] Appl. No.: 08/806,559

[22] Filed: Feb. 25, 1997

Related U.S. Application Data

[62] Division of application No. 08/212,165, Mar. 11, 1994, Pat. No. 5,623,443.

[51] Int. Cl.$^6$ ................................................ H01L 21/336
[52] U.S. Cl. ...................... 438/258; 438/294; 438/299; 438/279; 365/185; 365/185.16; 365/185.13; 365/230.06
[58] Field of Search ............................... 438/258, 294, 438/299, 279

[56] References Cited

U.S. PATENT DOCUMENTS

| | | | |
|---|---|---|---|
| 4,235,010 | 11/1980 | Kawagoe | 29/571 |
| 4,271,421 | 6/1981 | McElroy | 357/41 |
| 4,365,263 | 12/1982 | Kawagoe | 357/45 |
| 5,117,389 | 5/1992 | Yiu | 365/104 |
| 5,151,375 | 9/1992 | Kazerounian et al. | 437/43 |
| 5,204,835 | 4/1993 | Eitan | 365/185 |
| 5,319,593 | 6/1994 | Wolstenholme | 365/185 |
| 5,327,378 | 7/1994 | Kazerounian | 365/185 |
| 5,346,842 | 9/1994 | Bergemont | 437/52 |
| 5,496,754 | 3/1996 | Bergemont et al. | 437/43 |
| 5,623,443 | 4/1997 | Kazerounian et al. | 365/185.16 |

FOREIGN PATENT DOCUMENTS

| | | |
|---|---|---|
| 0 537 169 A1 | 12/1993 | European Pat. Off. . |
| 58-025261 | 2/1983 | Japan . |

OTHER PUBLICATIONS

Kammerer et al., W., "A New Virtual Ground Array Architecture for Very High Speed, High Density Eproms", Institute of Electrical and Electronics Engineers, May 30, 1991, pp. 83–84.

*Primary Examiner*—John F. Niebling
*Assistant Examiner*—Neal Berezny
*Attorney, Agent, or Firm*—Skjerven, Morrill, MacPherson, Franklin & Friel LLP

[57] ABSTRACT

An electrically programmable read-only memory (EPROM) array having self-aligned thick oxide isolation units, and a method for manufacturing the EPROM array are disclosed. The EPROM array is formed of EPROM areas having EPROM cells and control areas, two per EPROM area. Each control area includes at least one row and each row includes a first polysilicon strip, a second polysilicon strip lying on top of and perpendicular to the first polysilicon strip, and alternating thick and thin oxide elements under the first polysilicon strip. The thick and thin oxide elements are self-aligned to the first polysilicon strip. The thin oxide and the first and second polysilicon strips form a select transistor. The thick oxide and the first and second polysilicon strips form a novel self-aligned thick oxide isolation unit.

4 Claims, 9 Drawing Sheets

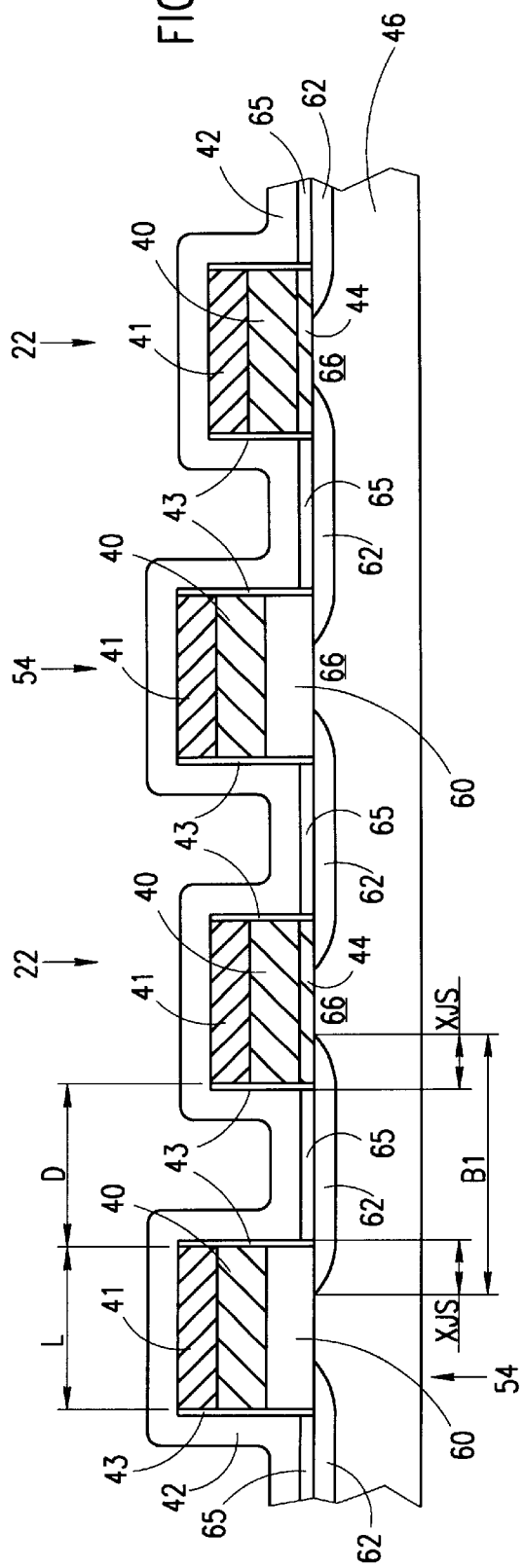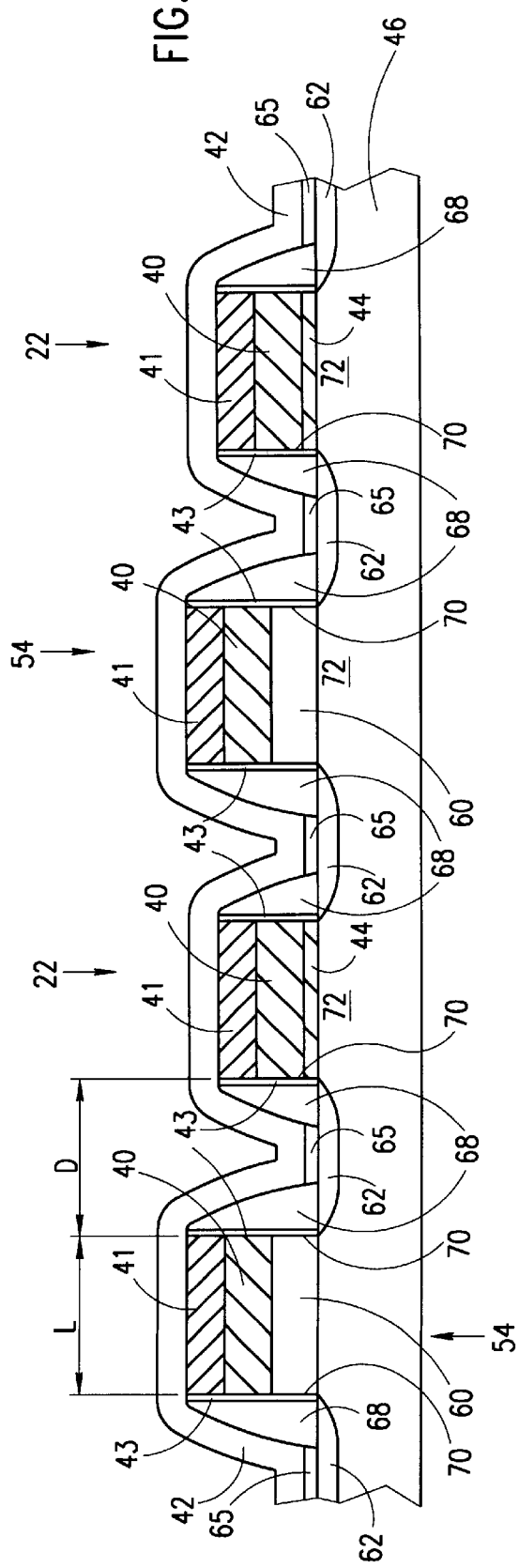

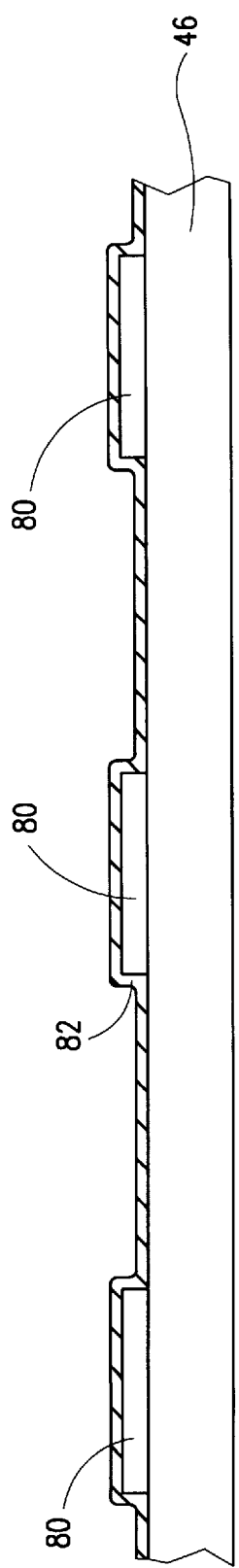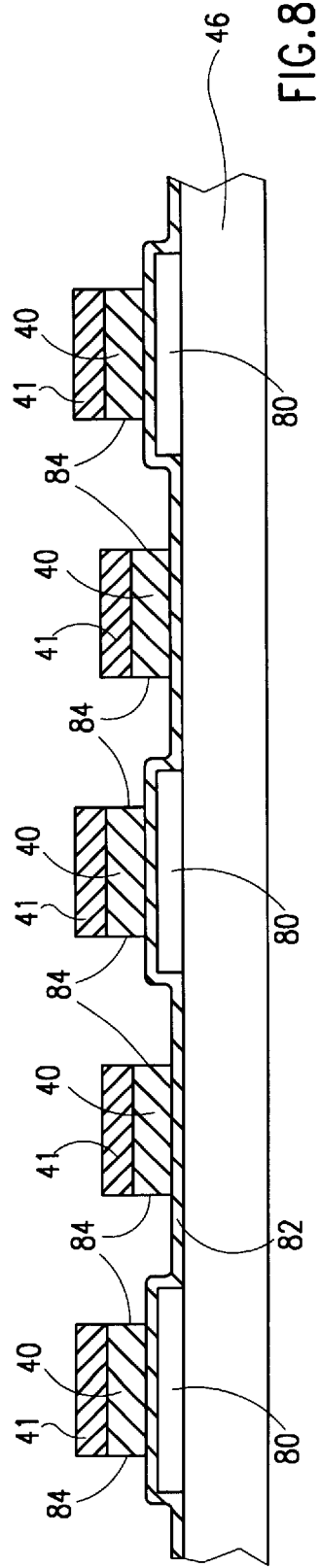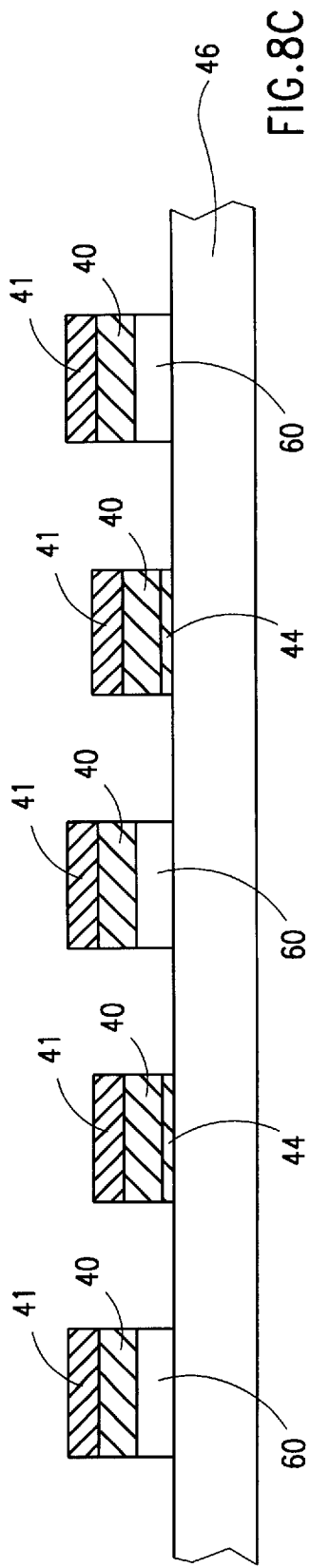

SCALABLE EPROM ARRAY

This application is a division of application Ser. No. 08/212,165, filed Mar. 11, 1994, now U.S. Pat. No. 5,623,443.

FIELD OF THE INVENTION

The present invention relates to electrically programmable read only memory (EPROM) arrays generally and to EPROM arrays whose size is generally "poly pitch limited" in particular.

BACKGROUND OF THE INVENTION

Virtual ground EPROM arrays are known in the art. Also known are alternating metal virtual ground EPROM arrays, described in U.S. Pat. Nos. 5,151,375 and 5,204,835, assigned to the common assignees of the present invention.

In the Background of the '375 and '835 patents, it is noted that the general trend in the EPROM industry is to reduce the size of each EPROM cell in the array. This has been done in a number of ways: by reducing the "design rule", (i.e. the minimum width of features on the lithographic masks used to produce the shapes of the integrated circuit elements) and by changing the architecture to one which utilizes less space. The design rule is determined by the capabilities of the lithographic processes with which the EPROM array is produced.

In general, an architecture usually can only be produced in a few different size design rules. For each architecture, there is usually one or two design rules any smaller than which the EPROM array cannot economically be produced, either due to poor resulting yields or to manufacturing expense.

The ideal architecture would be one all of whose elements are dependent only on the design rule. Such an architecture would reduce in size as the design rule decreases in size, without approaching a limit. One version of the ideal architecture is known as a "poly pitch limited" architecture whose size is a function of the pitch of lines of polycrystalline silicon (polysilicon or "poly") used to create an EPROM cell. The basic EPROM cell is detailed in FIG. 1, to which reference is now made.

An EPROM array 10 comprises two polysilicon layers, called "poly 1" and "poly 2". The polysilicon layers are produced on a semiconductor substrate (not shown) in a grid having intersecting lines 30 of poly 1 and lines 32 of poly 2. Parallel, spaced apart doped regions 34, known as diffusion bit lines, are formed in the silicon substrate between and in alignment with the poly 1 lines 30.

The area around an "intersection" of a poly 1 line 30 and a poly 2 line 32 is an EPROM transistor or cell 12, wherein the portion of the poly 1 line 30 beneath the poly 2 line 32 is a floating gate of the EPROM transistor 12.

In an ideal cell 12, the width of each poly 1 and poly 2 line is L, where L is the design rule, and the space between the lines is D. A typical value for L in a 0.8 $\mu$m technology is 0.8 $\mu$m. The area of the EPROM cells 12 is then $(L+D)^2$ where L+D is known as the "pitch" of each line. If L and D are equal, which is the ideal, then the area is $4 L^2$. A cell 12 having an area of $4 L^2$ is "poly pitch limited" in that it depends only on the pitch of the poly lines 30 and 32.

The alternating metal virtual ground EPROM array described in U.S. Pat. Nos. 5,151,375 and 5,204,835 is generally, though not completely, a poly pitch limited architecture. The teachings of U.S. Pat. Nos. 5,151,375 and 5,204,835 are incorporated herein by reference. With reference to FIG. 2, the following is a brief discussion of the alternating metal virtual ground architecture and operation.

The EPROM array of U.S. Pat. Nos. 5,151,375 and 5,204,835 comprises an EPROM area 10 comprising a plurality of EPROM transistors 12, or cells, surrounded by two "control areas" 14 comprising control elements, detailed hereinbelow.

In the EPROM area 10, each cell 12 comprises a gate 16, a source 18 and a drain 20. The sources 18 of a column of EPROM cells 12 together form non-metal-strapped, segmented diffusion bit lines, labeled S−1, S and S+1. The drains 20 of a column of EPROM cells 12 together form metal-strapped, continuous diffusion bit lines labeled M−1, M and M+1. Segmented bit lines S−1, S and S+1 typically connect together N EPROM cells 12, where N is typically 64. The gates 16 of a row of cells are connected to one word line WLi.

Each control area 14 comprises select transistors 22, contacts 26 and select lines SELn and SEL(n+1). Select transistors 22 are typically stacked gate transistors but can also be n-channel devices. One contact 26 is connected to each bit line M−1, M or M+1 in each control area 14.

A pair of select transistors 22 from two neighboring control areas 14 are operative, when activated by the appropriate select lines SELn or SEL(n+1), to connect one segmented diffusion bit line S−1, S or S+1 to a neighboring continuous diffusion bit line M−1, M or M+1.

In order to access the EPROM cell labeled 12a, the following lines are activated: word line WL1, select lines SEL(n+1) and bit lines M and M−1. Bit line M receives the drain voltage and bit line M−1 receives the source voltage. The select transistors 22 which are activated by select lines SEL(n+1) transfer the source voltage from bit line M−1 to the segment S−1. Word line WL1 activates a row of EPROM cells and bit lines M and M−1 activate a column of cells, thereby activating only EPROM cell 12a, which sits at the intersection of the activated row and column. The output of the EPROM cell 12a is provided through the contact 26 which is connected to the appropriate bit line.

In order to ensure that the current only flows between the strapped and non-strapped bit lines M and S−1, respectively, through selected EPROM cell 12a, neighboring select transistors 22 are isolated from each other. This is illustrated in FIG. 2 by spaces 24 which, in reality, are field oxide isolation units 24 (shown in FIG. 3A). Units 24 isolate the select transistors 22 from each other such that no current flows between them.

Unfortunately, the isolation units 24 are not poly pitch limited, as shown in FIGS. 3A and 3B to which reference is now made. FIGS. 3A and 3B are schematic cross-sectional views of one area 14 having a few isolation units 24 and select transistors 22.

The transistors 22 and isolation units 24 have very similar structures. Each comprise a strip 40 of poly 1, of width L, covered by a strip of poly 2, labeled 42. They each also typically comprise sandwich layers 41, located between the two poly layers, and side oxides 43. Each sandwich layer 41 comprises a poly-poly dielectric formed of an oxide-nitride-oxide (ONO) dielectric layer capped by a polysilicon and a nitride layer.

In the select transistors 22, the poly 1 strip 40 lies on a thin, gate oxide strip 44 laid on top of a semiconductor substrate 46 (the "wafer") formed of silicon. When the select transistor 22 is active, current flows through an area 45 under the gate oxide strip 44, known as the "channel".

In the isolation units 24, the poly 1 strip lies on top of a very thick, field oxide element 48, typically of a thickness of 5000 Å or greater. This thickness is large enough to ensure that the isolation unit 24 generally does not leak current.

As can be seen, each field oxide element 48 is not completely coincident with its corresponding strip 40 of poly 1. In fact, the field oxide elements 48 extend beyond the poly 1 strips 40. These extensions are known as "oxide beaks", labeled 50, and their size varies with manufacturing variations. The oxide beaks 50 extend into the area of the bit lines and reduce their width. The remaining portions of diffusion bit lines are labeled 52.

The isolation units 24 are not poly pitch limited for at least two reasons, as described hereinbelow.

Firstly, in order to ensure complete isolation, the minimum feature width Q of the field oxide element layer 48 is typically wider than the poly width L. Additionally, the oxide beaks 50 extend beyond the minimum feature width Q, by an imprecisely controllable distance.

Secondly, the mask used to produce the poly 1 strips 40 is often misaligned with the mask used to produce the field oxide elements 48, causing the poly 1 strips 40 to be misplaced vis-a-vis the field oxide elements 48. The resultant cross-section is illustrated in FIG. 3B, wherein a poly 1 strip 40*a* is too close to a field oxide element 48*a*.

If poly 1 strip 40*a* is very close to field oxide element 48*a*, the material (typically arsenic) used to implant the bit line diffusions 52 will not reach the silicon of the wafer 46 and the bit line diffusion 52, in the area of the field oxide element 48*a*, will have a discontinuity. Therefore, no bit line diffusion 52 is shown between strip 40*a* and field oxide element 48*a*. The resultant select transistor 22 fails to electrically connect the metal-strapped bit line (M) to its neighboring segmented bit line (S).

If the space between poly 1 strip 40*a* and field oxide element 48*a* is such that some arsenic, but not enough, succeeds in implanting, the bit line diffusion 52 will be too narrow and will have a high resistance. The signal from a select transistor 22 having such a bit line will be weak during reading and the rate of programming will be slow.

Therefore, in the prior art, when determining a distance J between strips 40 of poly 1, the following was considered: a minimal spacing SPACE between the field oxide element 48 and the adjacent poly 1 strip 40 necessary to ensure successful implantation of the bit line diffusion 52, the expected size BEAK of the oxide beak, the expected variation OXIDE in the size of the oxide beak 50, the expected extent MISALIGN of the misalignment, and the expected variation ETCH in the width of the poly 1 caused by the poly 1 etch. The distance J is given as:

$$J > SPACE + BEAK + \sqrt{OXIDE^2 + MISALIGN^2 + ETCH^2} \quad (1)$$

where "sqrt" indicates the square root function. Table 1 lists the variables of equation for the 0.8 μm process such as is described in U.S. Pat. No. 5,151,375 and for a smaller 0.5 μm process. The value of J provided is the minimal value of J.

TABLE 1

VALUES FOR VARIABLES OF EQUATION 1
(in μm)

| Variable | 0.8 μm process | 0.5 μm process |
|---|---|---|
| SPACE | 0.35 | 0.3 |
| BEAK | 0.35 | 0.25 |
| OXIDE | 0.1 | 0.05 |
| MISALIGN | 0.3 | 0.2 |
| ETCH | 0.1 | 0.05 |
| Minimum J | 1.03 | 0.76 |
| Ideal Cell Size | 2.56 | 1.0 |
| Actual Width Between Cells | 1.0 | 0.6 |
| Actual Cell Size | 3.25 | 1.39 |
| Percentage Increase Between Ideal and Actual Pitch | 27% | 39% |

For an 0.8 μm process, a J of 1.03 μm is only 27% larger than the desired poly pitch of 0.8 μm. However, for a 0.5 μm process, a J of 0.76 μm is an unacceptable increase of 39%. For the 0.5 μm process, J is still large because, although the design rule for lithographic processes is less, the values for BEAK, OXIDE, MISALIGN and ETCH are not reduced accordingly. As can be seen, the variables BEAK, OXIDE, MISALIGN and ETCH limit the extent to which any design can truly become poly pitch limited.

It will be appreciated that the pitch of the cell along a row (the X pitch) is the same as the size required for the control area 14. Thus, the cell ceases to be poly pitch limited.

SUMMARY OF THE PRESENT INVENTION

It is an object of the present invention to provide a generally compact isolation scheme for the control area of an alternating metal ground architecture for an EPROM array thereby to provide a more closely packed EPROM architecture. In the present invention there are no oxide beaks and no misalignment between the poly 1 strips and the field oxide elements. Furthermore, the isolation elements of the present invention have the same lithographic variation as the poly 1 strips.

There is therefore provided, in accordance with a preferred embodiment of the present invention, an EPROM array formed of two areas, an EPROM area having a plurality of EPROM cells and a control area having select transistors and novel isolation units which are self-aligned. Each isolation unit comprises a thick oxide element over which an EPROM transistor, formed of poly 1 and poly 2 layers, is placed. The thick oxide element is etchable and self-aligned to the poly 1 layer.

Since the thickness of the thick oxide element is less than that of the field oxide elements of the prior art, the isolation units of the present invention leak some current. However, the thickness of the thick oxide is selected to ensure that the leakage of the isolation units is significantly smaller than a leakage between bit lines, as described in detail in the detailed description hereinbelow. A typical thickness is 1000–2000 Å.

Because the thick oxide element is etched, there are no oxide beaks. Because the thick oxide element is etched at the same time as the poly 1 layer, the thick oxide element is self-aligned to the poly 1 layer, thereby avoiding misalignment problems and providing the isolation units with the same lithographic variation as the poly 1 layer.

In one embodiment, spacers are additionally laid down next to the poly 1 strips. The spacers minimize the bit line width to that of the space between poly 1 strips.

There is also provided, in accordance with a preferred embodiment of the present invention, an EPROM array including a plurality of columns each including: a) two columns of a first polysilicon layer, b) a virtual source aligned between said two columns of first polysilicon, c) an EPROM area and d) at least one control area. In the EPROM area there preferably are a plurality of rows of second polysilicon lying on top of said first polysilicon columns which form, at the intersections thereof with the columns of first polysilicon, a first group and a second group of EPROM transistors. Each EPROM transistor in said first and second groups is connected to said virtual source. The control area typically includes two rows, each row including: a) a row of second polysilicon lying on top of and perpendicular to said columns of first polysilicon and b) alternating thick and thin oxide elements under said first polysilicon columns. The thick and thin oxide elements are self-aligned to the columns of first polysilicon and the intersection of the thick oxide and the first and second polysilicon form self-aligned thick oxide isolation units. First select transistors are formed at the intersection of thin oxide, the first polysilicon columns and one row of the second polysilicon in the control area. The first select transistors are connected between the virtual source and a first bit line which functions as a drain for the first group of EPROM transistors but as a source for the second group of EPROM transistors. Second select transistors are formed at the intersection of thin oxide, the first polysilicon columns and the other row of the second polysilicon in the control area. The second select transistors are connected between the virtual source and a second bit line which functions as a drain for the second group of EPROM transistors but as a source for the first group of EPROM transistors. The first and the second select transistors are arranged so that the second select transistor acts as a control transistor for each of the EPROM transistors in the first group of EPROM transistors and the first select transistor acts as a control transistor for each of the EPROM transistors in the second group of EPROM transistors.

There is also provided, in accordance with a preferred embodiment of the present invention, a method of manufacturing the isolation units. The method includes the steps of a) creating areas of thick oxide and areas of thin oxide in the control areas, b) with a mask, laying down strips of first polysilicon over at least a part of each of the thick and thin oxide portions and c) etching the thick and thin oxide portions in accordance with the mask, thereby to align the thick and thin oxide portions with the strips of first polysilicon.

Additionally, the step of etching is preferably performed with a 20:1 etch process.

Finally, the method can also include, after the step of etching, the step of laying down a spacer next to the strips of first polysilicon.

BRIEF DESCRIPTION OF THE DRAWINGS

The present invention will be understood and appreciated more fully from the following detailed description taken in conjunction with the drawings in which:

FIGS. 3A and 3B are schematic cross-sectional views of a control area of the prior art EPROM array of FIG. 2, wherein FIG. 3A illustrates aligned layers and FIG. 3B illustrates misaligned layers;

FIGS. 4A and 4B are schematic cross-sectional views of two embodiments of a control area of an alternating metal virtual ground EPROM array having novel isolation units, constructed and operative in accordance with a preferred embodiment of the present invention;

FIGS. 8A, 8B, 8C, 8D and 8E are schematic cross-sectional views of the control area of the EPROM array showing the fabrication process for the control areas of FIGS. 4A and 4B.

DETAILED DESCRIPTION OF A PREFERRED EMBODIMENT

Figure 5:
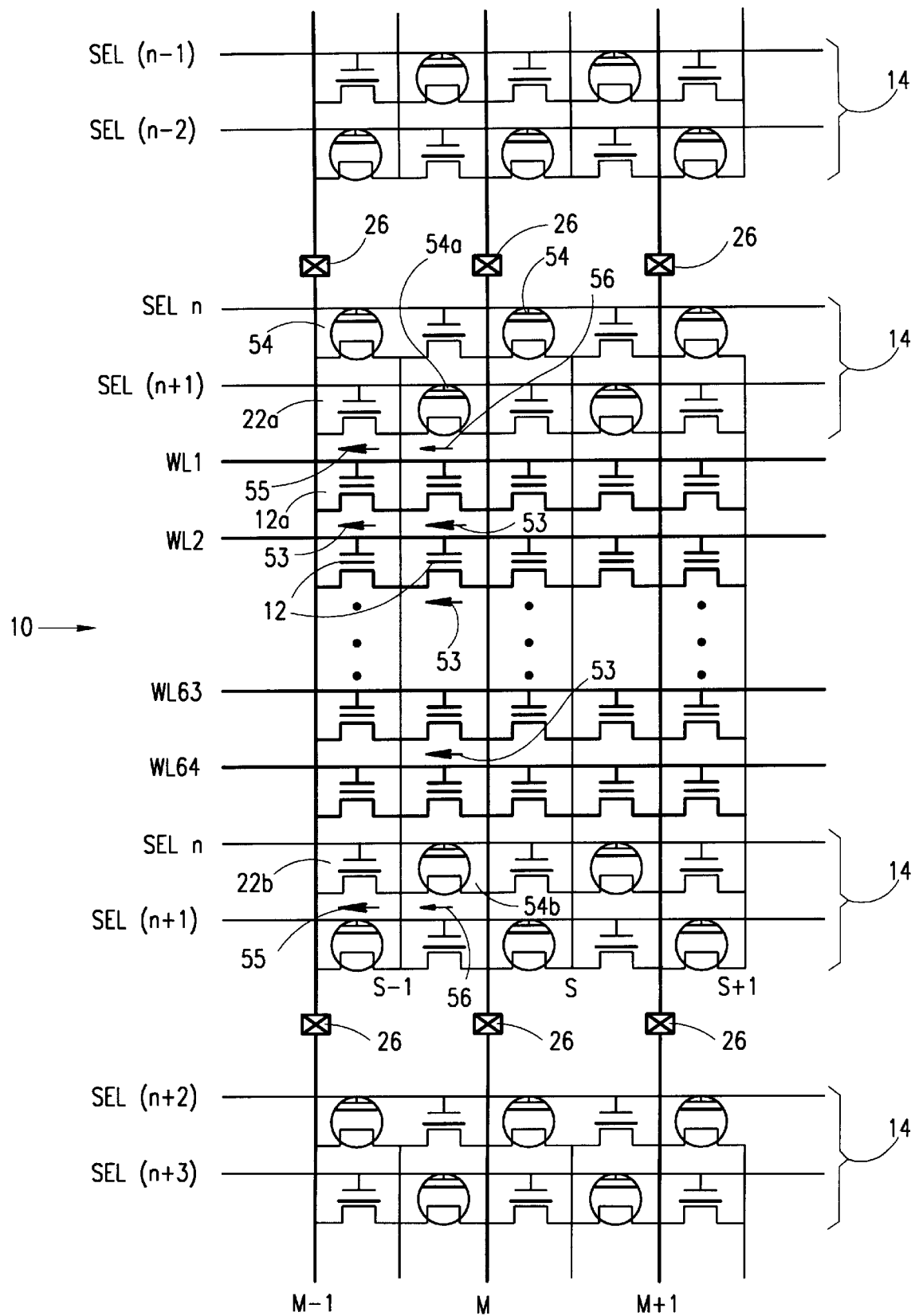
FIG. 5 is a schematic circuit diagram illustration of the EPROM array having the control areas of FIGS. 4A and 4B.

Reference is now made to FIGS. 4A, 4B and 5 which illustrate the EPROM array of the present invention. FIGS. 4A and 4B are cross-sectional illustrations of two embodiments of the control area 14 of the EPROM array, constructed and operative in accordance with the present invention. FIG. 5 is a schematic circuit diagram illustration of the EPROM architecture.

Figure 1:
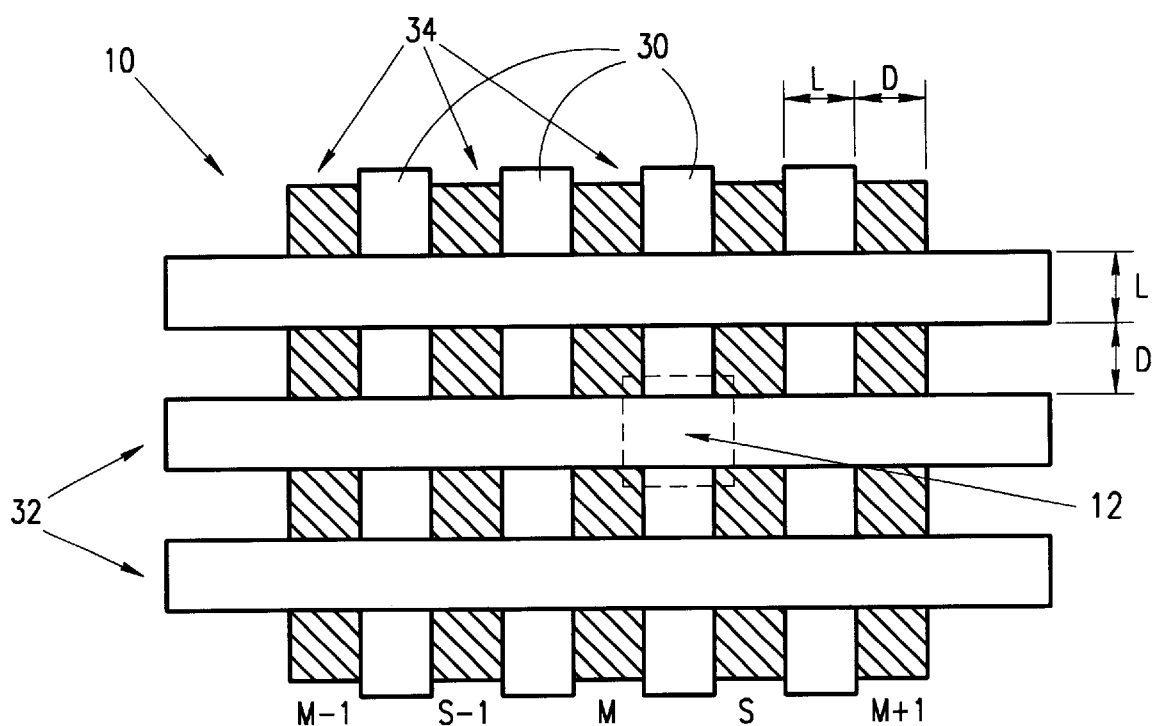
FIG. 1 is a schematic illustration of an ideal layout of a portion of a prior art EPROM array.
Figure 2:
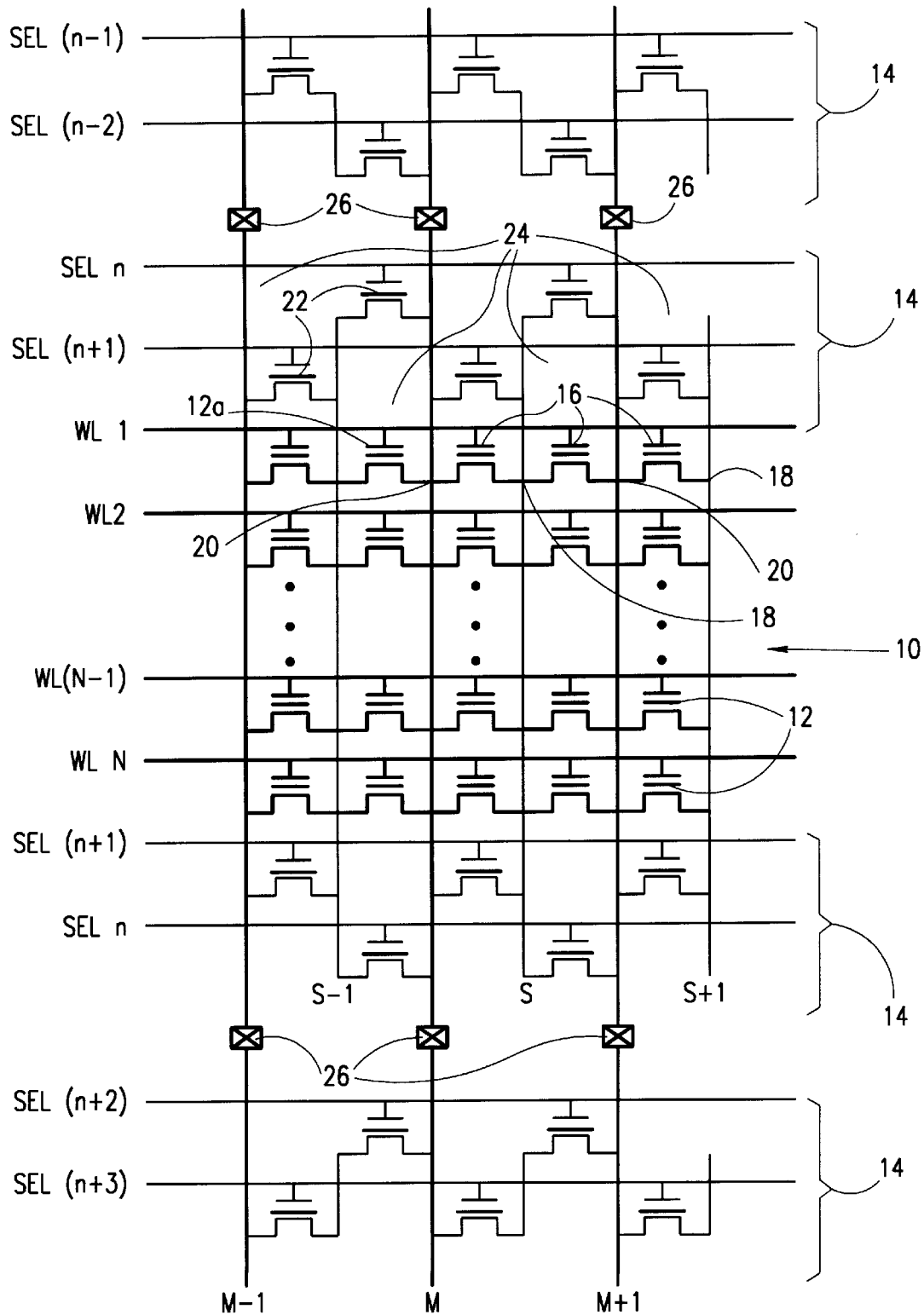
FIG. 2 is a schematic circuit diagram illustration of a prior art alternating metal virtual ground EPROM array.

The EPROM array of the present invention is similar to that shown in FIG. 2, and described in U.S. Pat. Nos. 5,204,835 and 5,151,375 already incorporated by reference, except that the control area 14 comprises novel, thick oxide isolation units, labeled 54.

Figure 3A:
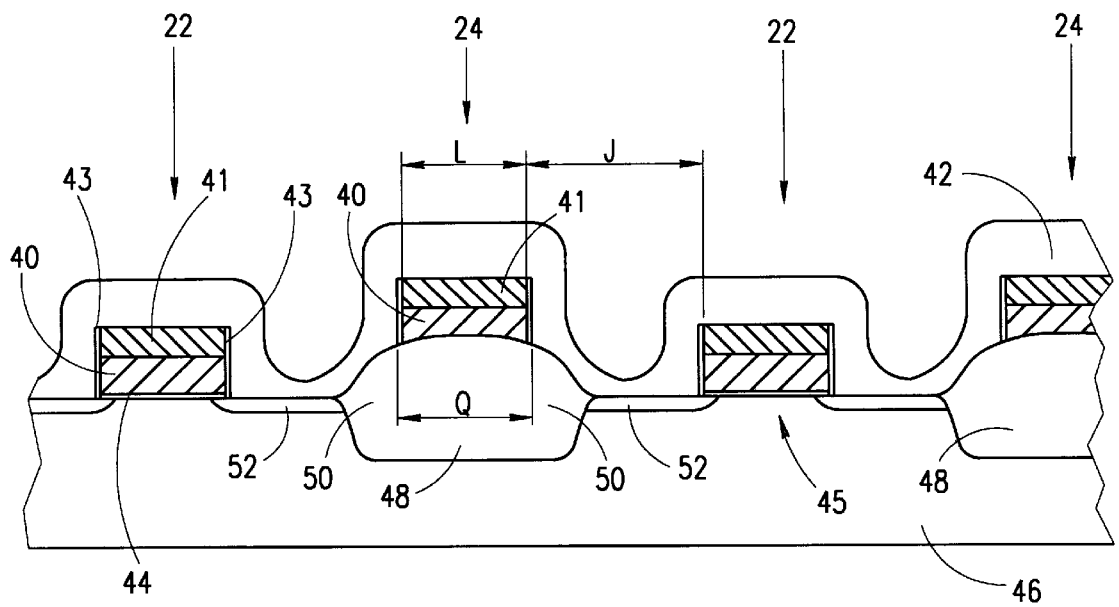
Figure 3B:
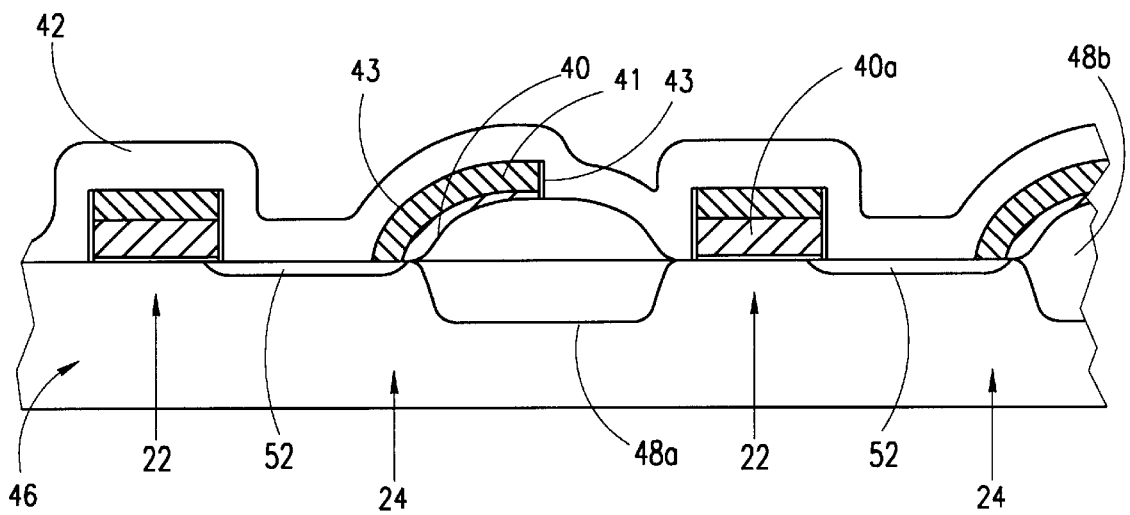

As shown in FIGS. 4A and 4B, the thick oxide isolation units 54 of the present invention typically comprise a thick oxide element 60, typically having a thickness in the range of 1000–2000 Å. The thick oxide element 60 replaces the field oxide element 48 (FIG. 3) of the prior art which is usually 5000 Å thick. Those of the remaining elements which are similar to the prior art have similar reference numerals and will not be detailed herein except to note that the similar elements are the poly 1 and poly 2 strips 40 and 42, the sandwich layer 41, the side oxides 43 and the substrate 46.

In accordance with a preferred embodiment of the present invention, the thick oxide element 60 is etchable and is self-aligned to the poly 1 and sandwich strips 40 and 41, respectively. The maximal thickness of the thick oxide element 60 is determined by the etch process which, during etching, consumes the silicon of substrate 46 in a process known as "trenching". For the types of processes currently envisioned, a trenching of 50–100 Å is maximal.

The etching process preferably occurs after the poly 1 and sandwich strips 40 and 41, respectively, have been formed but before removal of the masks used to define them. The thick oxide element 60 is then etched with the same masks, thereby providing self-alignment to the poly 1 and sandwich strips 40 and 41, respectively.

It will be appreciated that, because of the self-aligned etching of thick oxide element 60, there are no oxide beaks nor any misalignment between the poly 1 layer 40 and the oxide layer below it. Therefore, in accordance with the present invention, the space, labeled D, between poly 1 lines 40 can have the same width as the lithographic design rule L, which is the width of the poly 1 lines 40. In other words, the architecture of the present invention is more poly pitch limited than that of the prior art.

Because the space D is generally consistently of width L, the bit lines, labeled 62 in FIG. 4A and 64 in FIG. 4B and covered by bit line oxides 65, can generally be implanted throughout the EPROM array. Thus, most of the select transistors 22 are operative, which improves the yield and performance of the integrated circuit.

As is known in the art, the implanted material of the bit lines generally diffuses to the side after implantation. Therefore, in the control area 14 shown in FIG. 4A, the bit line 62 has a width B1 which is wider than the width D by an amount 2*XJS. If the width 2*XJS approaches the width L, the select transistor 22 will have no channel, labeled 66. This problem also occurs between the poly 1 lines in the EPROM array 10. If the width 2*XJS approaches the width L, the EPROM cells 12 will have no channel.

The embodiment of FIG. 4B solves this problem by including spacers 68 along the side 70 of the poly 1 lines 40. The spacers 68 are laid down before the bit line implant. As is known in the art, spacers 68 serve to reduce the space in which the bit lines 64 can implant. With the spacers 68 in place, when the bit line implants diffuse, they diffuse just past edges 70 of the poly 1 lines, as shown, thereby creating a channel 72 of a reasonable size.

It is noted that the maximal spacer width depends on the height of sides 70. For example, if the sides 70 are 1.2 $\mu$m high, each spacer 68 will be 0.15 $\mu$m wide and, since there are two spacers 68 per bit line, the total width utilized will be 0.3 $\mu$m. Thus, in order to ensure that the bit lines can implant when utilizing spacers, for design rules much smaller than 0.5 $\mu$m, the height of sides 70 should be minimized.

It is noted that, because the thick oxide element 60 is considerably thinner than the field oxide element 48 of the prior art, when a select transistor 22 is selected, its neighboring isolation units 54 produce a weak current. This is illustrated in FIG. 5.

If EPROM cell 12a is selected, voltage is provided on the following lines: word line WL1, the two select lines SEL (n+1) and bit lines M and M−1. Significant current, indicated by thick arrows 55, will occur in select transistors 22a and 22b and in EPROM cell 12a. Some current, indicated by arrow 53, also flows through the unselected cell, labeled 12b, next to cell 12a and through the cells in the column of selected EPROM cell 12a. A leakage current in the isolation units 24, Ileak, is indicated by thin arrows 56.

Figure 6:
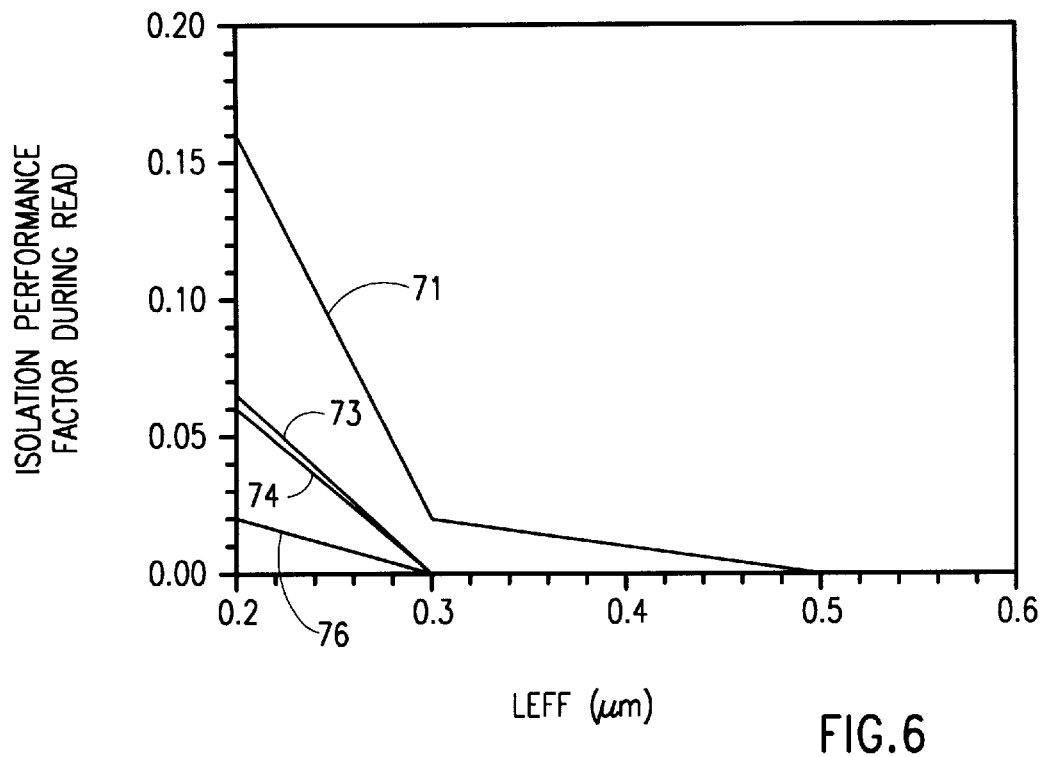
FIG. 6 is a graphical illustration of isolation performance during a read operation as a function of effective channel length and thickness of a thick oxide element forming part of the novel isolation unit of FIGS. 4A and 4B.
Figure 7:
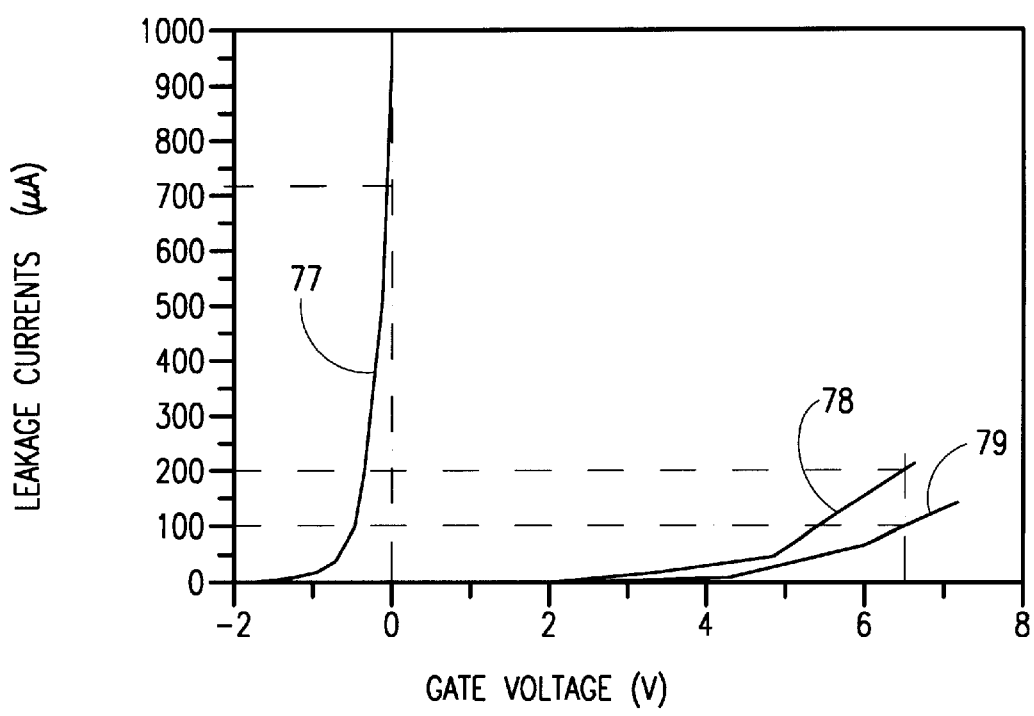
FIG. 7 is a graphical illustration of leakage current during programming as a function of gate voltage for a plurality of unselected EPROM cells and two isolation units of the present invention having two different thicknesses.
Figure 8D:
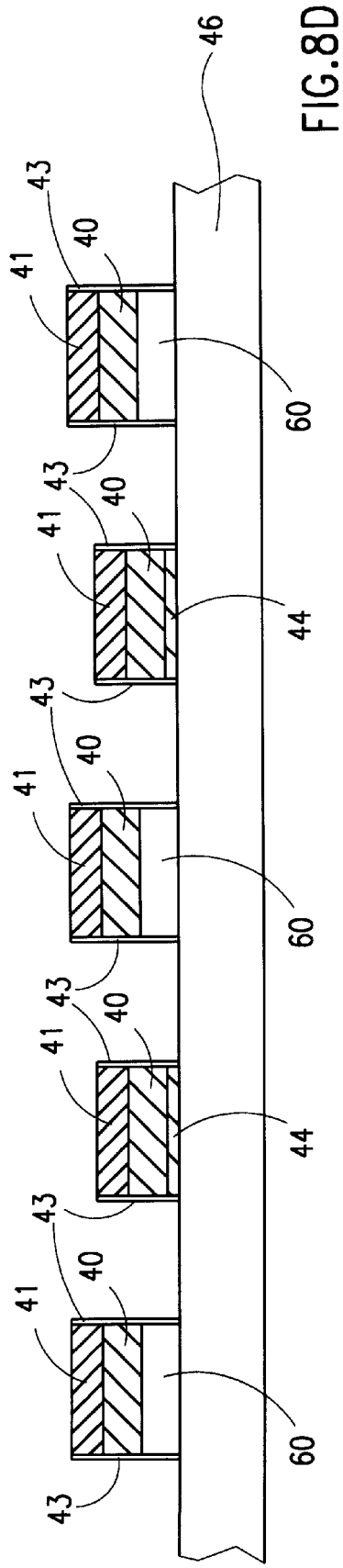
Figure 8E:
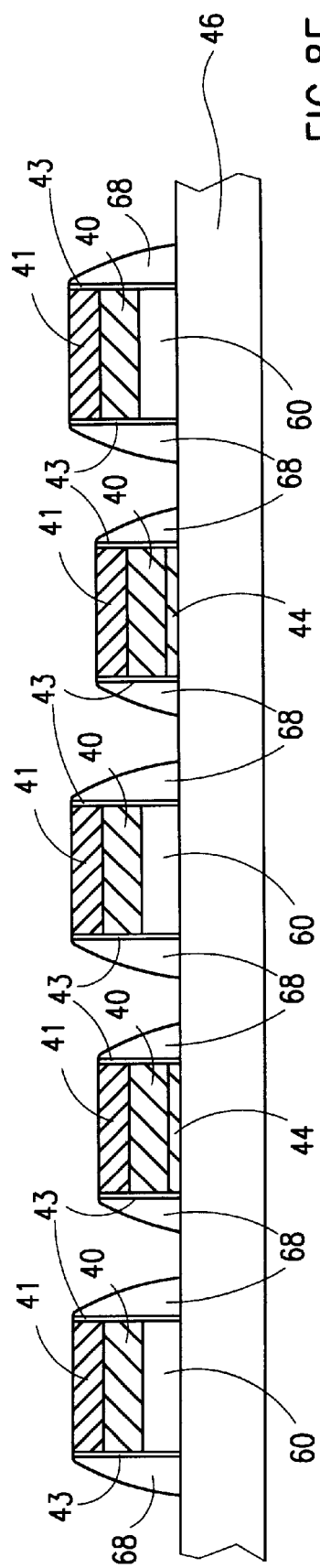

The extent of the leakage current, Ileak, is a function of the thickness, Tiso, of the thick oxide element 60. The thicker the thick oxide element 60 is, the less leakage current, Ileak, there will be, however, the thick oxide element 60 cannot be so thick that it cannot reasonably be etched. Therefore, the leakage current, Ileak, is accepted as long as it is significantly less than the current, Icell, in an activated but unprogrammed EPROM cell 12. FIGS. 6 and 7, to which reference is now made, indicate the effect of the leakage current, Ileak, as a function of thickness Tiso.

The following parameters were utilized to calculate the graphs of FIG. 6:

VWL=VSEL=4.75V

Weff(SEL)=2*(Weff(cell))  (2)

Tprom=150 Å

Tono=200 Å where VWL is the word line voltage, VSEL is the select line voltage, Weff is the effective channel width, "SEL" stands for select transistor 22 and "cell" stands for cell 12a, Tprom is the thickness of the oxide under poly 1 layer 40 and Tono is the thickness of the sandwich layer 41, all for a 0.5 $\mu$m design rule. The values of VWL and VSEL are typical for reading.

The following parameters were utilized to calculate the graphs of FIG. 7:

VWL=12V

VSEL=6.25V

VD=7V

Weff(iso)=2*(Weff(cell))  (3)

Tprom=150 Å

Tono=200 Å where VD is the drain (bit line) voltage. The values of VWL and VSEL are typical for programming.

FIG. 6 illustrates an isolation performance factor, defined as the ratio Ileak/Icell, during the read operation for a programmed and an unprogrammed EPROM cell 12, as a function of effective channel length Leff. Four graphs 71, 73, 74 and 76 are shown, each having a different combination of thickness, Tiso, of the thick oxide element 60 and voltage Vs provided to the source of the cell 12a. Graph 71 has Tiso=1000 Å and Vs=0, graph 73 has Tiso=1250 Å and Vs=0, graph 74 has Tiso=1000 Å and Vs=0.1V, and graph 76 has Tiso=1250 Å and Vs=0.1V.

FIG. 6 indicates that the isolation performance factor decreases with decreasing channel length and increasing thick oxide thickness. Since an acceptable isolation performance factor for reading, as dictated by design constraints, is less than 0.05 (i.e. the leakage current is 5% or less of the read current), for these parameters, Tiso should be greater than or equal to 1000 Å.

FIG. 7 illustrates the extent of the leakage currents which occur during programming of the EPROM array of the present invention. These leakage currents are due to the "punchthrough" phenomenon and occur in the unselected EPROM cells 12 in the column of selected EPROM cell 12a.

FIG. 7 graphs leakage current versus gate voltage for the unselected cells 12 (graph 77) and for isolation units 54 having two thicknesses, Tiso, of 1000 Å (graph 78) and 1250 Å (graph 79). FIG. 7 indicates that the unselected cells leak significantly more than an isolation unit 54 having a thick oxide element 60 of either thickness. Therefore, the thickness of thick oxide element 60 is determined only by the isolation performance factor for reading, as shown in FIG. 6.

FIGS. 6 and 7 indicate that the utilization of the thick oxide isolation units 54 does not significantly impair the operation of the EPROM array. It is noted that the thicknesses which provided good isolation performances in FIGS. 6 and 7 are within the etchable range defined hereinabove. This is at least partially due to the fact that thick oxide element 60 is covered by a double poly structure which increases the effective oxide thickness by about 200 Å.

It is further noted that the isolation performance factor is also a function of other factors not discussed herein, such as channel doping and the thickness Tprom of the dielectric, and therefore, must be optimized for a given process.

Reference is now made to FIGS. 8A–8E which illustrate the manufacturing process for the control area 14 of the EPROM array. FIGS. 8A–8E are cross-sectional views of the control area at different times during manufacturing.

In the following discussion, the process of etching a layer, which includes placing photoresist on the layer, placing a mask on the photoresist, etching wherever the mask is not and removing the photoresist, will not be detailed.

Except for process steps related to the manufacture of the thick oxide element 60, the EPROM array is manufactured via a process similar to that outlined in U.S. Pat. No. 5,151,375, whose teachings are already incorporated herein by reference.

Specifically, the first process steps are the standard initial CMOS process steps, including Nwell and field oxide element deposition.

In accordance with the present invention, a layer of isolation oxide, typically of 1200 Å thick, is then laid down in the control area 14 of semiconductor substrate 46. The oxidation step is a dry or HCL oxidation, performed at a temperature of 900°–1000° C.

The oxide is then etched with a mask to produce thick sections 80 (FIG. 8A) which are precursors to the thick oxide elements 60. Typically, the sections 80 are wider than oxide layers 60 and will be etched back in a later step.

A floating gate oxide layer 82 is grown next over the entire array, after the mask of the previous step is stripped. The floating gate oxide layer 82 is typically 150 Å thick and is produced in accordance with standard processes. It is noted that the floating gate oxide layer is added to the thick oxide layer laid down previously. Portions of floating gate oxide layer 82 will later become the thin oxide layer 44.

The resultant side view is shown in FIG. 8A.

In accordance with standard EPROM process steps, a layer of poly 1 is laid down over the entire array and doped. Thereafter, the ONO layers of the sandwich layer 41 are laid down on top of poly 1 layer.

In accordance with U.S. Pat. No. 5,151,375, the nitride and poly cap layers of the sandwich portion 41 are then laid down. Afterwards, the poly 1 and sandwich layers are etched in accordance with a poly 1 mask to produce the poly 1 and sandwich portions 40 and 41, respectively, in both the control and EPROM areas 14 and 10, respectively. It is noted that the poly 1 and sandwich layers in the periphery of the EPROM array are not etched. For the purpose of the following discussion, the poly 1 and sandwich portions 40 and 41, respectively, will herein be called a "poly 1 unit".

FIG. 8B illustrates the resultant side view of the control area 14. It is noted that, after the etch step, one poly 1 unit is located on top of and one between each thick section 80, wherein thick and floating gate oxide extends beyond edges 84 of the poly 1 units. The poly 1 units on top of the thick sections 80 will later become isolation units 54 and the other poly 1 units, lying on top of only floating gate oxide layer 82, will later become select transistors 22.

In accordance with a preferred embodiment of the present invention, the next step is a self-aligned oxide etch. The etch step utilizes the poly 1 mask (which has not yet been removed) and removes thereby the oxide between the poly 1 strips, including those portions of the thick sections 80 which extend beyond the edges 84 of the poly 1 units located thereon and of the floating gate oxide 82 not under a poly 1 unit. This step creates the thick oxide elements 60, comprised of thick sections 80 and some floating gate oxide 82, and the thin oxide layer 44.

A 20:1 etch which minimizes etching, is currently desirable. This can be produced by a model 9400 etcher manufactured by LAM Research Inc. of Fremont, Calif., USA.

The resultant side view of the self-aligned oxide etch step is illustrated in FIG. 8C.

In the next step, the poly 1 mask is removed and side oxide 43, typically of 150 Å, is grown. The oxidation is a dry oxidation at 1000° C. The resultant side view is provided in FIG. 8D.

For the embodiment of FIG. 4B, a spacer material, such as silicon dioxide, is additionally deposited on top of the array in a standard low pressure chemical vapor deposition (LPCVD) process.

The spacer layer is then etched back with a dry anisotropic etch to attain a reasonable width. For example, for a 0.5 $\mu$m design rule, a suitable width is 0.15 $\mu$m. The resultant control area 14 is illustrated in cross-sectional view in FIG. 8E.

Figure 9:
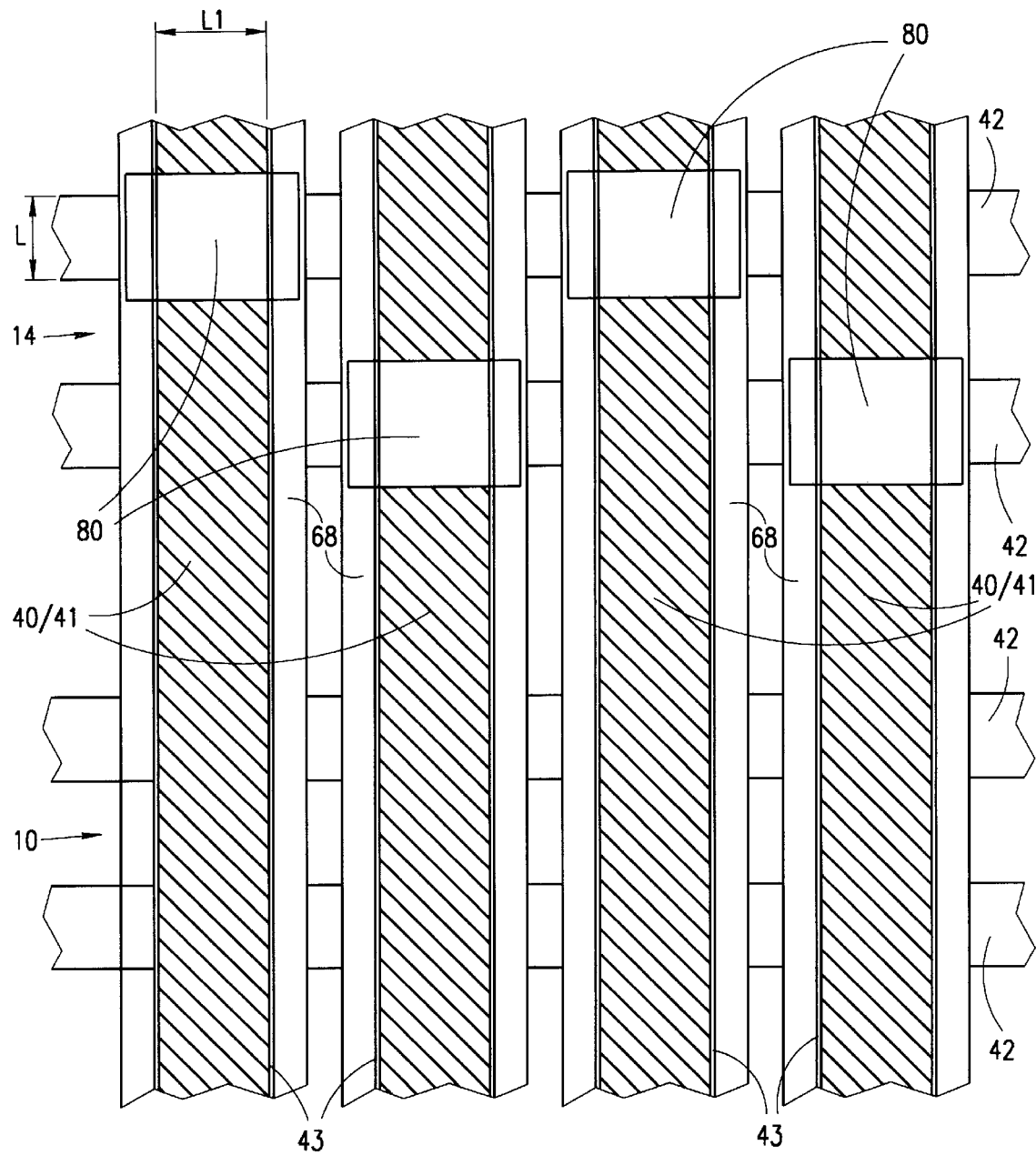
FIG. 9 is a layout illustration for the EPROM array of FIG. 5 showing part of a control and an EPROM area.

FIG. 9, to which reference is now briefly made, is a schematic layout of the layers described hereinabove, including the spacer layer for the embodiment of FIG. 4B. A portion of a control area 14 and an EPROM area 10 are illustrated, wherein the hatched areas indicate the poly 1 layer 40, the light grey areas indicate thick oxides 60, the bounded white areas indicate the poly 2 layer 42 and the thick black areas indicate the spacers 68. The layout is believed to be understandable with the description hereinabove and therefore, for the purposes of conciseness, will not be described in more detail.

The remaining process steps for both embodiments are the same as that of U.S. Pat. No. 5,151,375. Specifically, the bit lines 64 (FIG. 4A) are implanted and grown in the spaces between poly 1 units, bit line oxides 65, covering the implanted bit lines 62 or 64, are grown, the poly 2 layer 42 is laid down and etched, and the finishing steps are performed. The resultant cross-sections, corresponding to FIGS. 8D and 8E, respectively, are provided in FIGS. 4A and 4B.

It will be appreciated that the process described hereinabove produces thick oxide isolation units 54 which are self-aligned to the poly 1 units. The size of such transistors can easily be reduced since they are self-aligned.

It will be appreciated by persons skilled in the art that the present invention is not limited to what has been particularly shown and described hereinabove. Rather the scope of the present invention is defined only by the claims which follow:

We claim:

1. For an alternating metal virtual ground EPROM array having EPROM areas and control areas, each control area comprising select transistors and isolation units located between neighboring ones of the select transistors, the method of manufacturing the isolation units comprising the steps of:

creating areas of thick oxide and areas of thin oxide in said control areas;

with a mask, laying down strips of first polysilicon over at least a part of each of said thick and thin oxide portions; and etching said thick and thin oxide portions in accordance with said mask, thereby to align said thick and thin oxide portions with said strips of first polysilicon.

2. A method according to claim 1 and wherein said step of etching is performed with a 20:1 etch process.

3. A method according to claim 1 and wherein said thick oxide portion has a thickness of 1000–2000 Å.

4. A method according to claim 1 and including, after the step of etching, the step of laying down a spacer next to said strips of first polysilicon.

* * * * *